US006180956B1

(12) United States Patent
Chondroudis et al.

(10) Patent No.: US 6,180,956 B1
(45) Date of Patent: Jan. 30, 2001

(54) THIN FILM TRANSISTORS WITH ORGANIC-INORGANIC HYBRID MATERIALS AS SEMICONDUCTING CHANNELS

(75) Inventors: Konstantinos Chondroudis, North White Plains; Christos D. Dimitrakopoulos, West Harrison; Cherie R. Kagan, Ossining; Ioannis Kymissis, New Hyde Park; David B. Mitzi, Chappaqua, all of NY (US)

(73) Assignee: International Business Machine Corp., Armonk, NY (US)

( * ) Notice: Under 35 U.S.C. 154(b), the term of this patent shall be extended for 0 days.

(21) Appl. No.: 09/261,515

(22) Filed: Mar. 3, 1999

(51) Int. Cl.$^7$ .................................................. H01L 35/24
(52) U.S. Cl. ............................. 257/40; 257/76; 257/289
(58) Field of Search .............................. 257/40, 76, 289 257/347

(56) References Cited

U.S. PATENT DOCUMENTS

| | | | |
|---|---|---|---|
| 5,168,024 | * 12/1992 | Yamamoto et al. | 430/58 |
| 5,206,525 | * 4/1993 | Yamamoto et al. | 257/40 |
| 5,347,144 | 9/1994 | Garnier et al. | 257/40 |
| 5,418,389 | * 5/1995 | Watanabe | 257/295 |
| 5,871,579 | * 2/1999 | Liang et al. | 117/68 |
| 5,882,548 | * 3/1999 | Liang et al. | 252/301.6 |
| 6,023,073 | * 2/2000 | Strite | 257/40 |

FOREIGN PATENT DOCUMENTS 3-8375 * 1/1991 (JP).

OTHER PUBLICATIONS

Era et al., "Organic–inorganic heterostructure electroluminescent device . . . " Appl. Phys. Lett. 65(6) 8 Aug. 1994, pp. 676–678.*

Tokito et al., "Structures and optical properties of organic/inorganic superlattices" Appl. Phys. Lett. 64(11), Mar. 14, 1994, pp. 1353–1355.*

* cited by examiner

Primary Examiner—Sara Crane
(74) Attorney, Agent, or Firm—Ohlandt, Greeley Ruggiero & Perle

(57) ABSTRACT

An FET structure in accordance with the invention employs an organic-inorganic hybrid material as the semiconducting channel between source and drain electrodes of the device. The organic-inorganic material combines the advantages of an inorganic, crystalline solid with those of an organic material. The inorganic component forms an extended, inorganic one-, two-, or three-dimensional network to provide the high carrier mobilities characteristic of inorganic, crystalline solids. The organic component facilitates the self-assembly of these materials and enables the materials to be deposited by simple, low temperature processing conditions such as spin-coating, dip-coating, or thermal evaporation. The organic component is also used to tailor the electronic properties of the inorganic framework by defining the dimensionality of the inorganic component and the electronic coupling between inorganic units.

11 Claims, 5 Drawing Sheets

(PEA)$_2$ SnI$_4$

BDA SnI$_4$

THIN FILM TRANSISTORS WITH ORGANIC-INORGANIC HYBRID MATERIALS AS SEMICONDUCTING CHANNELS

FIELD OF THE INVENTION

This invention relates to thin film field effect transistor structures and, more particularly, to such transistor structures which employ organic-inorganic hybrid materials as semiconducting channels therein.

BACKGROUND OF THE INVENTION

Thin film transistors, known as TFTs, are widely used as switching elements in electronics, most notably for large area applications such as active matrix liquid crystal displays. The TFT is an example of a field effect transistor (FET). The best known FET is the MOSFET (Metal-Oxide-Semiconductor-FET), today's conventional switching element for high speed electronic applications. While the MOSFET specifically refers to $SiO_2$/bulk-Si transistors, more general combinations of Metal-Insulator-Semiconductors are known as MISFETs. The TFT is a MISFET in which the active semiconducting layer is deposited as a thin film.

Presently TFTs in most devices are made using amorphous silicon as the semiconductor. Amorphous silicon provides a cheaper alternative to crystalline silicon—a necessary condition for reducing the cost of transistors used in large area applications. Application of amorphous silicon is limited to slower speed devices since its mobility, $\sim 10^{-1}$ $cm^2/V^*sec$, is 15,000× smaller than that of crystalline silicon. Although amorphous silicon is cheaper to deposit than crystalline silicon, deposition of amorphous silicon still requires costly processes, such as plasma enhanced chemical vapor deposition.

Recently organic semiconductors have received attention as potential semiconductor components for TFTs. See, for example, U.S. Pat. No. 5,347,144 to Garnier et al., entitled "Thin-Layer Field Effect Transistors With MIS Structure Whose Insulator and Semiconductor Are Made of Organic Materials". Organic materials (e.g., small molecules, short-chain oligomers, and polymers) may provide a less expensive alternative to inorganic materials for TFT structures, as they are simpler to process by methods such as spin-coating or dip-coating from solution, thermal evaporation, or screen printing. However, while the mobilities of organic materials have improved, their mobilities are still low and only the best materials have mobilities approaching that of amorphous silicon.

Organic semiconductors are less expensive and easier to deposit than conventional, amorphous silicon. Such organic materials are either small molecules (e.g. pentacene, metal-phthalocyanines), short-chain oligomers (e.g. n-thiophenes where n=3–8), or long-chain polymers (e.g. poly-alkylthiophenes or poly-phenylenevinylenes). Atomic orbital overlap between adjacent, multiply bonded atoms, known as conjugation, enables the transport of charge along molecules, oligomers, and polymers. Molecular orbital overlap between adjacent molecules enables inter-molecular charge transport.

Thin films of small molecules or short-chain oligomers show the highest mobilities for organic materials. The small molecules/short-chain oligomers showing these high mobilities have been deposited by thermal evaporation where they are deposited as highly ordered thin films. The high degree of ordering in the films provides orbital overlap and therefore charge transport between adjacent molecules. Long-chain polymers are advantageous since they are more soluble, enabling deposition by low cost techniques such as spin-coating and dip-coating, but have lower mobilities since they are more disordered.

While organic materials open up the possibility of depositing semiconductors for TFTs by cheaper and easier deposition techniques such as thermal evaporation, spin-coating, and dip-coating, their mobilities are still lower than desired. Typical mobilities for small molecules/short-chain oligomers range from $10^{-3}$ to $10^{-1}$ $cm^2/V^*sec$ and for long-chain polymers range from $10^{-8}$ to $10^{-2}$ $cm^2/V^*sec$. The highest mobilities reported are 0.7 $cm^2/V^*sec$ for thin films of pentacene and 0.13 $cm^2/V^*sec$ for thin films of dihexyl,α-sexithiophene. A mobility of 0.3 $cm^2/V^*sec$ measured for single crystal α-sexithiophene represents the upper limit in mobility for this material. The mobilities of organic semiconductors rival those of amorphous silicon.

Organic-inorganic hybrid materials are a distinct class of materials which enable the combining of the useful characteristics of organic and inorganic components within a single material. Some members of this class of materials exhibit semiconducting characteristics. For the purposes of this description, an organic-inorganic hybrid material is a material composed of: organic components and inorganic components which are mixed together on a molecular level, and (i) wherein the material is characterized by a substantially fixed ratio of each organic component to each inorganic component; (ii) wherein at least one component is semiconducting; and (iii) wherein both organic and inorganic components manifest forces that enable a self assembly therebetween into a predictable arrangement.

One example of an organic-inorganic hybrid material takes the form of an organic-inorganic perovskite structure. Layered perovskites naturally form a quantum well structure in which a two dimensional semiconductor layer of corner sharing metal halide octahedra and an organic layer are alternately stacked.

For preparation of such organic-inorganic hybrid materials, spin coating techniques are suitable because many organic-inorganic perovskites are soluble in conventional aqueous or organic solvents. Using this method, high quality, highly oriented layered perovskite thin films have been achieved. Vacuum evaporation techniques have also been used to grow films of layered perovskites. Copending U.S. patent applications, Ser. No. 09/192,130, entitled "Single-Source Thermal Ablation Method for Depositing Organic-Inorganic Hybrid Films" U.S. Pat. No. 6,117,498; and Ser. No. 08/935,071, entitled "Two-Step Dipping Technique for the Preparation of Organic-Inorganic Perovskite Thin Films", U.S. Pat. No. 5,871,579, assigned to the same Assignee as this Application, both speak to alternative deposition methods for organic-inorganic hybrid materials. The disclosure of the aforementioned Applications is incorporated herein by reference.

Accordingly, it is an object of this invention to provide an improved FET structure which makes use of an organic-inorganic hybrid material as a semiconducting channel.

It is another object of this invention to provide an improved FET structure which may be processed at low cost.

SUMMARY OF THE INVENTION

An FET structure in accordance with the invention employs an organic-inorganic hybrid material as the semiconducting channel between source and drain electrodes of the device. The organic-inorganic material combines the advantages of an inorganic, crystalline solid with those of an organic material. The inorganic component forms an extended, inorganic one-, two-, or three-dimensional network to provide the high carrier mobilities characteristic of inorganic, crystalline solids. The organic component facilitates the self-assembly of these materials and enables the materials to be deposited by simple, low temperature processing conditions such as spin-coating, dip-coating, or thermal evaporation. The organic component is also used to tailor the electronic properties of the inorganic framework by defining the dimensionality of the inorganic component and the electronic coupling between inorganic units.

DETAILED DESCRIPTION OF THE INVENTION

This invention makes use of organic-inorganic hybrid materials as semiconducting channels in thin film FETs. Organic-inorganic hybrid materials, comprising molecular scale composites of organic and inorganic materials offer potentially higher carrier mobilities than amorphous silicon, while also being inexpensive and easy to deposit. The inorganic component provides the high mobility characteristic of a crystalline, inorganic semiconductor, while the organic component contributes to self-assembly of the material from either solution or the gas phase. The organic-inorganic hybrid materials may be deposited by a number of techniques, including spin-coating, dip-coating, or thermal evaporation techniques. As with organic semiconductors, these methods are compatible with the requirements of both low cost and large area deposition for large area applications. The low temperature processing conditions of these deposition techniques also enable the possibility of depositing these materials on plastic substrates for flexible applications. In general, organic-inorganic hybrid materials may be substituted in all of the applications put forth for organic semiconducting materials. In addition to the ease of processing, the potentially higher mobilities of these materials may extend their application to higher speed devices than is presently possible with either amorphous silicon or organic semiconductors.

Figure 1:
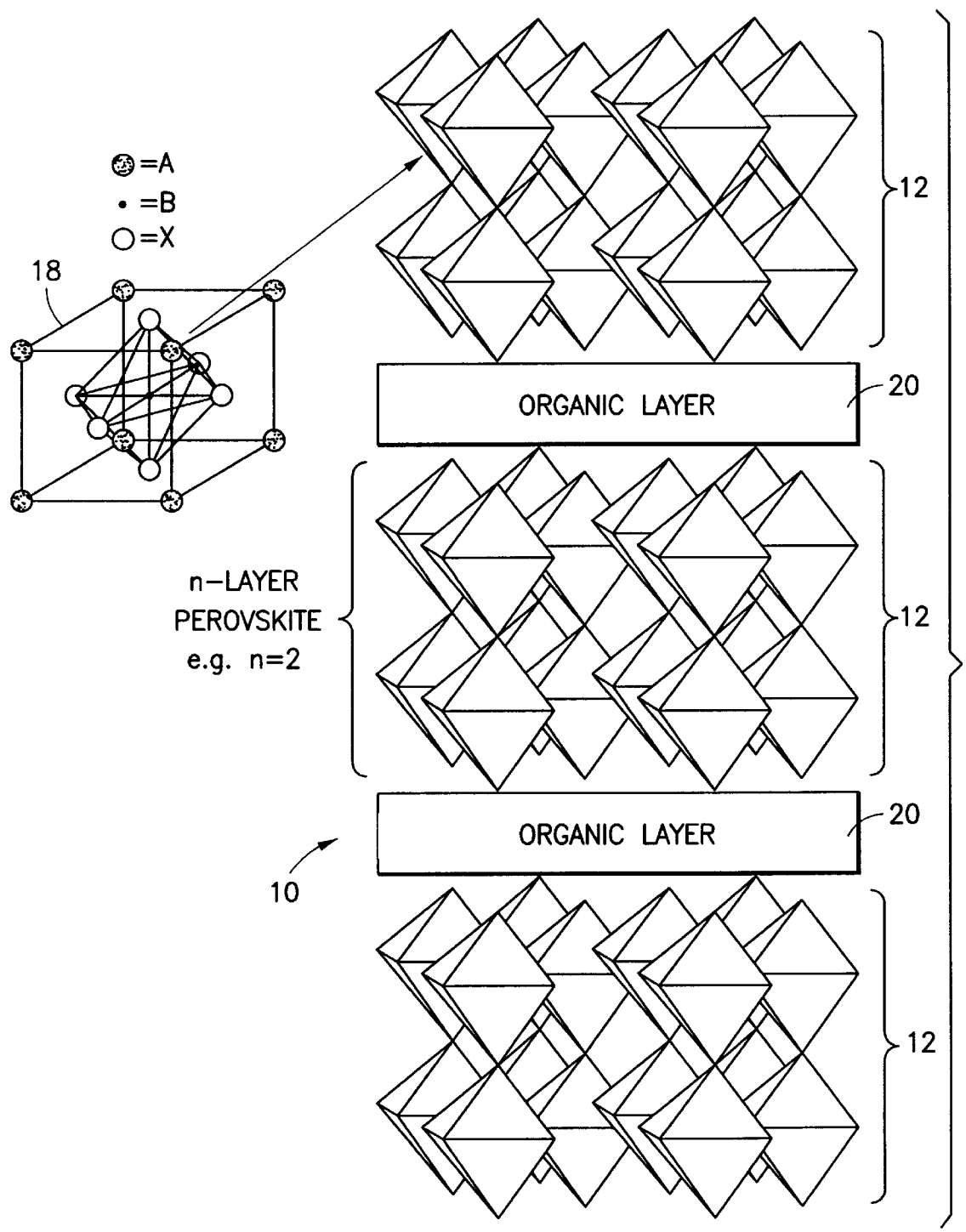
FIG. 1 depicts the structure of one example of an organic-inorganic hybrid material, in this case based on the perovskite structure.

The invention comprises a thin film FET having an organic-inorganic hybrid material as the active semiconductor layer. FIG. 1 illustrates one example of an organic-inorganic hybrid material 10 that is based on a three-dimensional perovskite structure, $ABX_3$. The perovskite structure comprises corner-sharing $BX_6$ octahedra 12. Each octahedron 12 is defined by six X anions at the vertices and one B cation in the center (see crystal schematic 18). The A cations sit in the large interstices between octahedra 12.

Layered inorganic compounds based on the three dimensional perovskite structure can be visualized by taking an n-layer thick "cut" (n=1 to infinity) along the <100> or <110> planes of the perovksite. In the organic-inorganic hybrid materials, the anionic, inorganic $BX_6$ octahedra of the perovksite sheets are charge balanced by cationic, organic molecules 20 forming alternating layers and/or sitting in the A cation interstitial sites. Examples of these materials include B=Group 14 (IV A), transition metal, and rare-earth elements; X=halogen (Cl, Br, or I), and A=organic ammonium or diammonium cation. The organic ammonium or diammonium cation may be aliphatic, such as an alkane, or aromatic, such as in the example provided. Other aromatic molecules include heterocyclic molecules. The organic molecules may be insulating, again as in the example provided, or semiconducting, such as oligothiophenes.

Inorganic perovskite sheets 12 and organic layers 20 are bound by strong, ionic and hydrogen bonding. The ionic bonding requires the organic-inorganic compound to have a specific stoichiometry and the organic molecules to sit in well-defined, crystallographic sites. The bonding between the organic and inorganic layers causes these hybrid materials to deposit as crystalline, thin films or to grow as single crystals.

Figure 2:
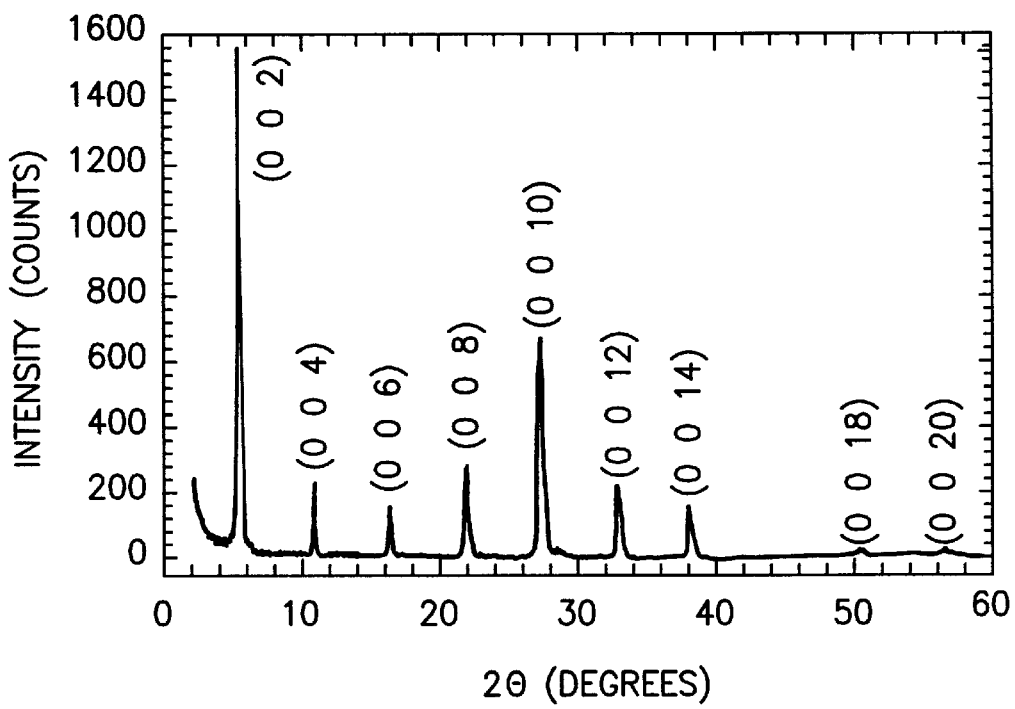
FIG. 2 is an X-ray diffraction pattern of a phenethylammonium tin iodide $(PEA)_2SnI_4$ film deposited by spin coating in a TFT device structure.

FIG. 2 is an x-ray diffraction pattern of the organic-inorganic hybrid material phenethylammonium tin iodide, $(PEA)_2SnI_4$, deposited in a TFT device structure. The presence of only the (001) reflections demonstrates that the material deposits as a well-oriented, crystalline thin film, with the organic and inorganic sheets parallel (or c-axis of the structure perpendicular) to the semiconductor substrate.

The organic-inorganic perovskites described above, as well as other organic-inorganic hybrid materials, combine the advantages of an inorganic, crystalline semiconductor with those of an organic material. The inorganic component forms an extended, inorganic one-, two-, or three-dimensional network to potentially provide the high carrier mobilities characteristic of inorganic, crystalline solids. The organic component facilitates the self-assembly of these materials. This enables the materials to be deposited by simple, low temperature processing conditions such as spin-coating, dip-coating, or thermal evaporation. The organic component is also used to tailor the electronic properties of the inorganic framework by defining the dimensionality of the inorganic component and the electronic coupling between inorganic units.

Figure 3:
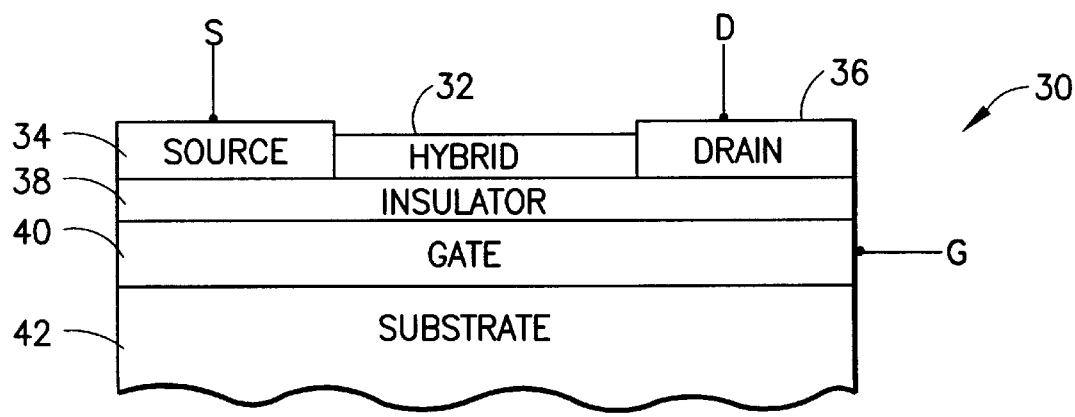
FIG. 3 is a cross-sectional view of a first TFT structure incorporating an organic-inorganic hybrid material as a semiconducting channel.

FIG. 3 shows a cross-sectional view of a typical TFT device structure 30. TFT 30 includes an organic-inorganic hybrid material layer 32. Layer 32 is an organic-inorganic perovskite and serves as the semiconducting channel between source and drain electrodes 34 and 36. The orientation of the material, as seen by x-ray diffraction, is such that the two dimensional inorganic sheets 12 provide the electrical connection between source and drain electrodes 34 and 36. The conductance of the organic-inorganic semiconductor is modulated across an electrically insulating layer 38, such as a thin $SiO_2$ film, by a gate electrode 40 (such as a degenerately doped, n++ silicon layer), all of which are supported by substrate 42.

Organic-inorganic hybrid material 32 may be deposited either before or after the metal deposition of source and drain electrodes 34 and 36. Depositing organic-inorganic hybrid material 32 afterwards reduces the material's exposure to potentially damaging high temperatures during metallization.

Figure 4:
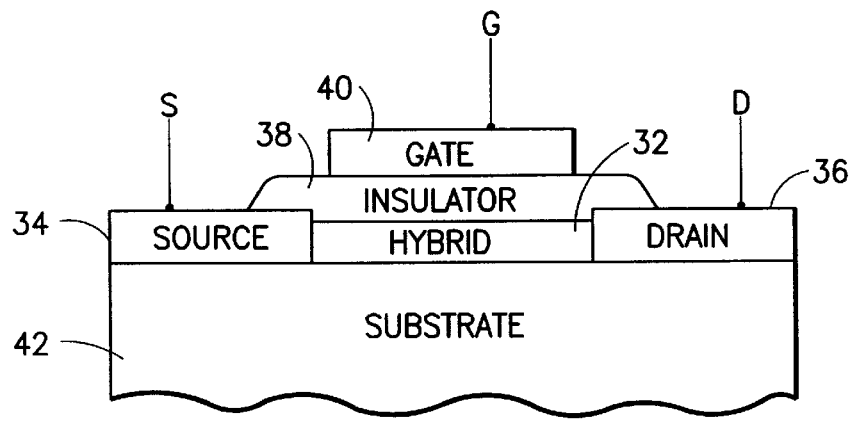
FIG. 4 is a cross-sectional view of a second TFT structure incorporating an organic-inorganic hybrid material as a semiconducting channel.

While FIG. 3 illustrates a typical FET structure arrangement, alternative structures are contemplated as within the ambit of the invention. See FIG. 4 where the respective elements of an alternative FET structure are illustrated and numbered identically as in FIG. 3. Alternative substrates include plastics such as polyimide and polycarbonate, which may be used to build flexible devices. In such an arrangement patterned metal gate electrodes are deposited on the substrate either through a shadow mask or by photolithography. The gate insulator is then deposited by one of a variety of methods which include, but are not limited to, spin-coating, chemical vapor deposition, sputtering or vacuum deposition. The organic-inorganic hybrid material and source and drain electrodes are then deposited as described above.

Figure 5:
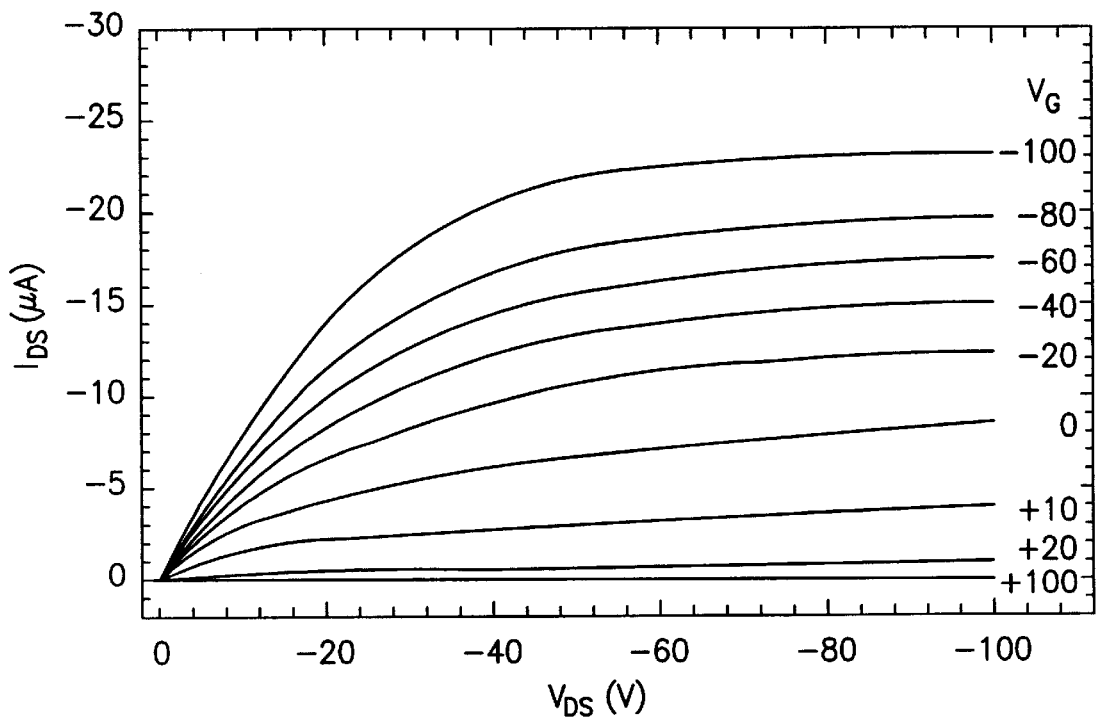
FIG. 5 is a plot of $I_{DS}$ versus $V_{DS}$ for a TFT with the organic-inorganic hybrid material $(PEA)_2SnI_4$ as the active semiconductor material.
Figure 6:
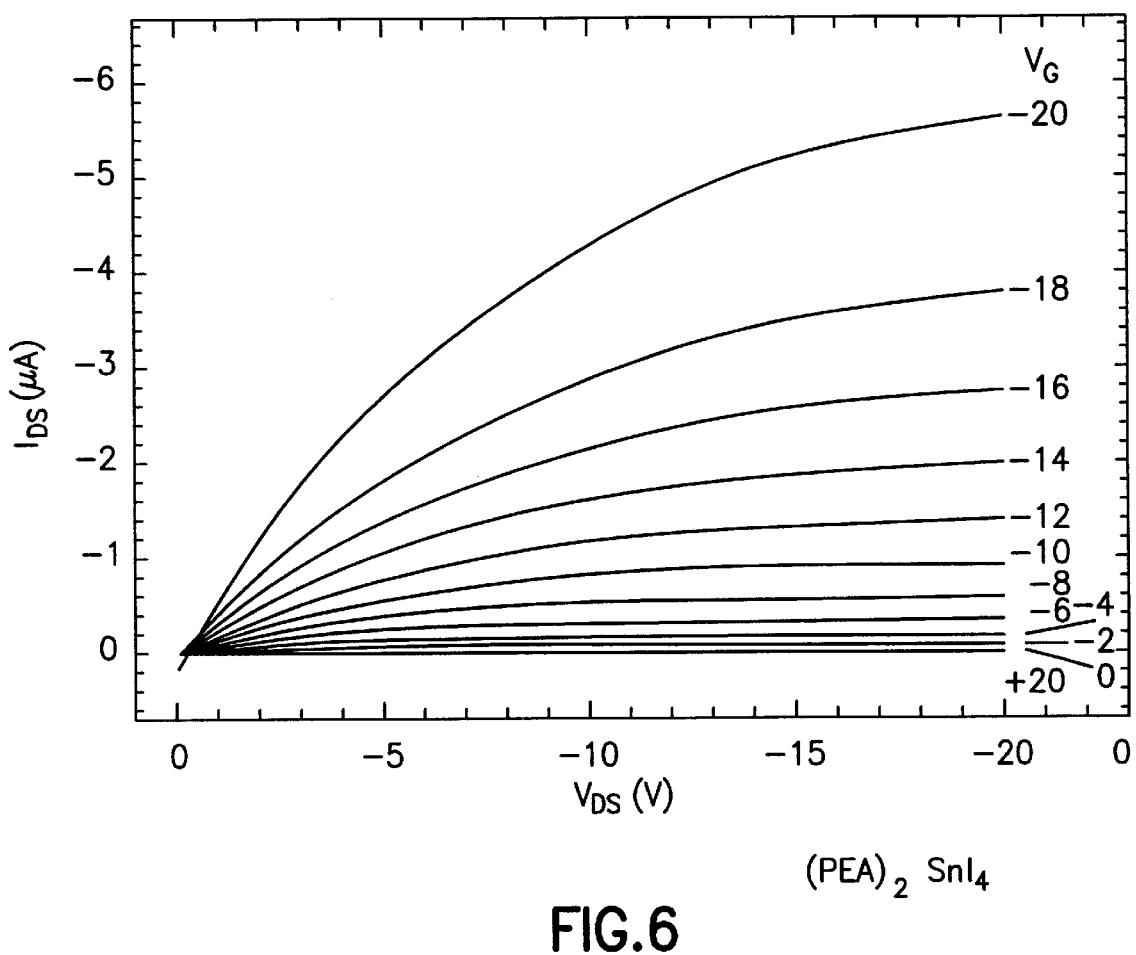
FIG. 6 is a plot of $I_{DS}$ versus $V_{DS}$ for a TFT with the organic-inorganic hybrid material $(PEA)_2SnI_4$ as the active semiconductor material and exhibiting the best characteristics achieved to date.

Preliminary data demonstrating the desired field-modulated conductance and current saturation for a TFT prepared with the organic-inorganic hybrid material (PEA)$_2$SnI$_4$ are shown in FIG. 5. In the measured device, a ~100Å (PEA)$_2$SnI$_4$ layer was spin-coated from acetonitrile on a 5000Å thick SiO$_2$ gate oxide. The semiconductor channel was defined by Au electrodes to be 70 $\mu$m in length and 1500 $\mu$m in width. In general, high work function metals such as Au, Pd, and Pt form "good" ohmic contacts to this organic-inorganic hybrid material. (PEA)$_2$SnI$_4$ is a "p-type" material as it transports holes through the semiconductor layer. This is apparent since the current flow through the semiconducting channel (I$_D$) increases with increasing negative gate bias (V$_G$) and source-drain voltage (V$_{DS}$) FIG. 6 is a plot of I$_{DS}$ versus V$_{DS}$ for a TFT with the organic-inorganic hybrid material (PEA)$_2$SnI$_4$ as the active semiconductor material and exhibiting the best characteristics achieved to date.

Figure 7:
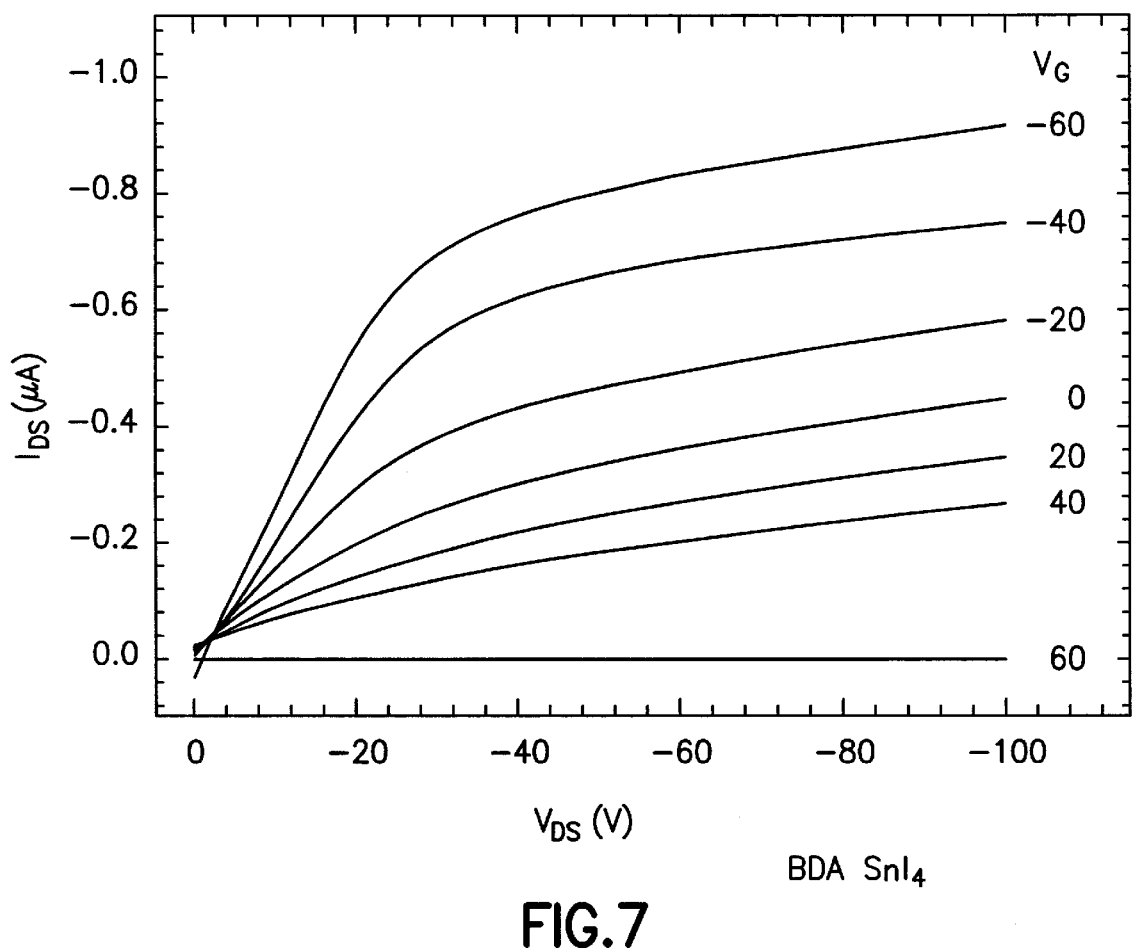
FIG. 7 is a plot of $I_{DS}$ versus $V_{DS}$ for a TFT with the organic-inorganic hybrid material containing an alkyl diammonium cation (i.e., $BDASnI_4$ (butyl diamm onium tin iodide)) as the active semiconductor material.

FIG. 7 is a plot of I$_{DS}$ versus V$_{DS}$ for a TFT with the organic-inorganic hybrid material containing an alkyl diammonium cation (i.e., BDASnI$_4$ (butyl diammonium tin iodide)) as the active semiconductor material.

Although mobilities of 0.06–0.25 cm$^2$/V*sec are lower than the expected intrinsic values, they are already approaching those of amorphous silicon and the best organic semiconductors. Notably, these mobilities are higher than for spin-coated organic semiconductors. Attainment of the higher intrinsic mobilities is expected to be achievable. While field effect mobilities have not been measured, reports of Hall effect mobilities range from ~1–100 cm$^2$/V*sec. Although the relationship between Hall mobilities and field effect mobilities may be complex, in very simple theory they are expected to be proportional. Therefore, these large Hall effect mobilities suggest that similarly large field effect mobilities, exceeding those of amorphous silicon, may be achieved. In addition to the organic-inorganic hybrid materials promising high mobilities, they may also be deposited by cheaper processing techniques than those common to inorganic solids. Techniques include spin-coating, dip-coating, or thermal evaporation.

The electronic properties of organic-inorganic hybrid materials may be tailored through chemistry. There is a wide-range of organic and inorganic components usable as the organic-inorganic hybrid material. The only requirement for this application is that one or both of the organic and inorganic components be semiconducting. Materials with desired properties may be designed by choosing the chemistry, crystal structure, and dimensionality of the inorganic component and the length and chemical functionality of the organic component. The flexibility in the chemistry of organic-inorganic hybrid materials may be used to prepare both n- and p-type transporting materials, desirable for complementary logic, and normally on- or off-TFTs.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A field effect transistor comprising:

a source region and a drain region;

a channel layer extending between said source region and said drain region, said channel layer comprising a semiconducting organic-inorganic hybrid material;

a gate region disposed in spaced adjacency to said channel layer, and an electrically insulating layer between said gate region and said source region, drain region, and channel layer.

2. A field effect transistor as set forth in claim 1, wherein said source region, channel layer and drain region are disposed upon a surface of a substrate, said electrically insulating layer is disposed over said channel layer and extending from said source region to said drain region, and said gate region is disposed over said electrically insulating layer.

3. A field effect transistor as set forth in claim 1, wherein said gate region is disposed as a gate layer upon a surface of a substrate, said electrically insulating layer is disposed upon said gate layer, and said source region, channel layer, and drain region are disposed upon said electrically insulating layer.

4. A field effect transistor as set forth in claim 1, wherein said organic-inorganic hybrid material is a material composed of: organic components and inorganic components which are mixed together on a molecular level, and (i) wherein the material is characterized by a substantially fixed ratio of each organic component to each inorganic component; (ii) wherein at least one component is semiconducting; and (iii) wherein both organic and inorganic components manifest forces that enable a self assembly therebetween into a predictable arrangement.

5. A field effect transistor as set forth in claim 1, wherein said semiconducting organic-inorganic hybrid material includes an inorganic component having a perovskite crystalline structure.

6. A field effect transistor as set forth in claim 5, wherein said semiconducting organic-inorganic hybrid material includes an alkyl monoammonium cation.

7. A field effect transistor as set forth in claim 5, wherein said semiconducting organic-inorganic hybrid material is phenethylammonium tin iodide, (PEA)$_2$SnI$_4$.

8. A field effect transistor as set forth in claim 5, wherein said semiconducting organic-inorganic hybrid material includes an alkyl diammonium cation.

9. A field effect transistor as set forth in claim 8, wherein said semiconducting organic-inorganic hybrid material is BDASnI$_4$ (butyl diammonium tin iodide) as the semiconductor material.

10. A field effect transistor as set forth in claim 1, wherein said substrate comprises a flexible material.

11. A field effect transistor as set forth in claim 1, wherein said substrate comprises a plastic material.

* * * * *